(12) United States Patent
Yang et al.

(10) Patent No.: US 12,484,198 B2
(45) Date of Patent: Nov. 25, 2025

(54) HEAT DISSIPATION SHEET, FABRICATION METHOD THEREOF, AND ELECTRONIC DEVICE USING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Zhenyu Yang, Wuhan (CN); Hanghang Deng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/621,207

(22) PCT Filed: Nov. 10, 2021

(86) PCT No.: PCT/CN2021/129788
§ 371 (c)(1),
(2) Date: Dec. 20, 2021

(87) PCT Pub. No.: WO2023/077534
PCT Pub. Date: May 11, 2023

(65) Prior Publication Data
US 2024/0032253 A1 Jan. 25, 2024

(30) Foreign Application Priority Data
Nov. 3, 2021 (CN) .......................... 202111292222.1

(51) Int. Cl.
*B32B 9/00* (2006.01)
*B33Y 10/00* (2015.01)
(Continued)

(52) U.S. Cl.
CPC .......... *H05K 7/20481* (2013.01); *B33Y 10/00* (2014.12); *B33Y 70/10* (2020.01); *C22C 9/00* (2013.01); *H05K 7/20963* (2013.01)

(58) Field of Classification Search
CPC .............. Y10T 428/30; H05K 7/20481; H05K 7/20963; B33Y 70/10
(Continued)

(56) References Cited

U.S. PATENT DOCUMENTS

| 2013/0059155 A1 | 3/2013 | Choi et al. |
| 2017/0092561 A1 | 3/2017 | Eid et al. |
| 2017/0115074 A1 | 4/2017 | Cheng |

FOREIGN PATENT DOCUMENTS

| CN | 103801686 A | 5/2014 |
| CN | 105722375 A | 6/2016 |

(Continued)

*Primary Examiner* — Daniel H Miller
(74) *Attorney, Agent, or Firm* — The Roy Gross Law Firm, LLC; Roy D. Gross

(57) ABSTRACT

The present application provides a heat dissipation sheet, a fabrication method thereof, and an electronic device using the same. The heat dissipation sheet is schistose and comprises a first graphene powder, and the heat dissipation sheet further comprises: a copper-graphene composite powder, mixed in the first graphene powder, wherein the copper-graphene composite powder is composed of a graphene-copper powder and a graphene powder. The heat dissipation sheet, the fabrication method thereof, and the electronic device using the same provided by the present application have better thermal conductivity and hydrophobic performance.

15 Claims, 3 Drawing Sheets

(51) Int. Cl.
 *B33Y 70/10* (2020.01)
 *C22C 9/00* (2006.01)
 *H05K 7/20* (2006.01)

(58) Field of Classification Search
 USPC ......................................................... 428/408
 See application file for complete search history.

(56) References Cited

FOREIGN PATENT DOCUMENTS

| | | | |
|---|---|---|---|
| CN | 106082186 A | * 11/2016 | |
| CN | 106670476 A | * 5/2017 | |
| CN | 106992161 A | * 7/2017 | |
| CN | 107164647 A | 9/2017 | |
| CN | 107331650 A | 11/2017 | |
| CN | 107606982 A | 1/2018 | |
| CN | 108303836 A | 7/2018 | |
| CN | 108329830 A | 7/2018 | |
| CN | 109332705 A | 2/2019 | |
| CN | 209993275 U | 1/2020 | |
| CN | 111117720 A | * 5/2020 | .......... C10M 125/00 |
| CN | 210607231 U | 5/2020 | |
| CN | 210835785 U | 6/2020 | |
| CN | 112129151 A | 12/2020 | |
| CN | 212062423 U | 12/2020 | |
| CN | 112582361 A | 3/2021 | |
| CN | 113039152 A | 6/2021 | |

* cited by examiner

HEAT DISSIPATION SHEET, FABRICATION METHOD THEREOF, AND ELECTRONIC DEVICE USING THE SAME

CROSS REFERENCE TO RELATED APPLICATIONS

This application is a National Phase of PCT Patent Application No. PCT/CN2021/129788 having International filing date of Nov. 10, 2021, which claims the benefit of priority of Chinese Application No. 202111292222.1 filed on Nov. 3, 2021. The contents of the above applications are all incorporated by reference as if fully set forth herein in their entirety.

FIELD OF INVENTION

The present application relates the field of heat dissipation technology, and particularly to a heat dissipation sheet, a fabrication method thereof, and an electronic device using the same.

BACKGROUND OF INVENTION

Graphene, due to its excellent thermal radiation properties, is made into a patch, which is used to the heat dissipation layer for the module of flip mobile phones. Although the thermal coefficient of graphene can be changed by modification, the space in the module for attaching graphene is not enough. In addition, because the advantages of graphene's heat dissipation and soaking heat evenly-spreading performance mainly embodied in the x and y directions, the thermal conductivity in the z direction is less prominent, which means that the thicker the graphene, the heat dissipation performance is poor. Further, water droplets have great damage to the module. Since the whole flip mobile phone cannot ensure reliable sealing, it is easy to cause malfunction such as short circuit and corrosion once the module gets wet.

SUMMARY OF INVENTION

Technical Problems

Therefore, the heat dissipation performance and waterproof (hydrophobic) performance of the heat dissipation sheet made of graphene in the existing technology need to be further improved.

Technical Solutions

Accordingly, the present application provides a heat dissipation sheet having better heat dissipation performance and hydrophobic performance, and a fabrication method thereof and an electronic device using the same are also provided.

In a first aspect, the present application provides a heat dissipation sheet, which is schistose and comprises a first graphene powder, further comprising:
    a copper-graphene composite powder, mixed in the first graphene powder, wherein the copper-graphene composite powder is composed of a graphene-copper powder and a graphene powder.

In an optional embodiment of the present application, the copper-graphene composite powder is spherical, and the diameter of the copper-graphene composite powder is 20 to 30 μm.

In an optional embodiment of the present application, the mass ratio of the copper powder and the graphene powder in the copper-graphene composite powder is (28 to 36):(15 to 21).

In an optional embodiment of the present application, the mass ratio of the first graphene powder and the copper-graphene composite powder is (39 to 52):(8 to 15).

In an optional embodiment of the present application, the mesh number of the first graphene powder is 625 to 1250 mesh.

In an optional embodiment of the present application, the heat dissipation sheet comprises a heat evenly-spreading layer and a plurality of microstructures formed on the heat evenly-spreading layer.

In an optional embodiment of the present application, the thickness of the heat evenly-spreading layer is 60 to 80 μm.

In an optional embodiment of the present application, each microstructure has a bump shape, and a cross section, parallel to the heat evenly-spreading layer, of each microstructure is defined by a first width "a" and a second width "b"; a height of each microstructure is defined by "c"; an interval between two adjacent microstructures is defined by "d"; and 200 μm<a<300 μm, 200 μm<b<300 μm, c>115 μm, and 200 μm<d<400 μm.

In a second aspect, the present application further provides a fabrication method for fabricating a heat dissipation sheet, comprising:
    providing and pulverizing a raw graphene material to fabricate a first graphene powder and a second graphene powder;
    fabricating a graphene-copper powder;
    mixing the graphene-copper powder and the second graphene powder in a specific proportion to form a copper-graphene composite powder;
    vibrationally mixing the copper-graphene composite powder and the first graphene powder to obtain a mixed powder; and
    printing the mixed powder to fabricate the heat dissipation sheet by 3D printing technology.

In an optional embodiment of the present application, the mass ratio of the copper powder and the graphene powder in the copper-graphene composite powder is (28 to 36):(15 to 21); and the mass ratio of the first graphene powder and the copper-graphene composite powder is (39 to 52):(8 to 15); the heat dissipation sheet comprises a heat evenly-spreading layer and a plurality of microstructures formed on the heat evenly-spreading layer; the thickness of the heat evenly-spreading layer is 60 to 80 μm; each microstructure has a bump shape, and a cross section, parallel to the heat evenly-spreading layer, of each microstructure is defined by a first width "a" and a second width "b"; a height of each microstructure is defined by "c"; an interval between two adjacent microstructures is defined by "d"; and 200 μm<a<300 μm, 200 μm<b<300 μm, c>115 μm, and 200 μm<d<400 μm.

In a third aspect, the present application further provides an electronic device, comprising an electronic device body; wherein the electronic device body comprises a display panel and a first backplane formed on a surface of the display panel; and wherein the electronic device further comprises a heat dissipation sheet, disposed on a surface of the display panel away from the first backplane.

In an optional embodiment of the present application, the electronic device body further comprises a buffer layer and a supporting plate, the buffer layer is formed on a surface of the first backplane away from the display panel, the supporting plate is formed on a surface of the buffer layer away from the first backplane, and the heat dissipation sheet is formed on a surface of the supporting plate away from the buffer layer.

In an optional embodiment of the present application, the heat dissipation sheet is attached to the supporting plate through an adhesive layer.

Beneficial Effect

The heat dissipation sheet, the fabrication method thereof, and the electronic device using the same of the present application provide the following advantages: 1) copper powder was added in the fabrication process of graphene heat dissipation sheet, so that the copper-graphene composite powder with good sphericity can be obtained through mixing the copper powder with part of the graphene by the gas atomization process; since copper has good thermal conductivity in the z direction, the composite of copper powder and graphene can improve the heat soaking evenly-spreading efficiency in all directions, and thus enhance the heat dissipation performance of the graphene heat dissipation sheet; 2) in the meanwhile, a heat evenly-spreading layer with specific microstructures can be fabricated by 3D printing technology, the heat evenly-spreading layer can not only increase the surface area to improve the heat dissipation efficiency of heat radiation, but also make water droplets on the surface of the heat dissipation sheet to form the Cassie state, so that the hydrophobic performance of the heat dissipation sheet can be improved; and 3) by forming the heat dissipation sheet on the electronic device body, the heat dissipation ability of the heat dissipation sheet can drain the heat generated by the electronic device body off to ensure the heat dissipation performance of the electronic device; in addition, the waterproof and hydrophobic characteristics of the heat dissipation sheet further prevent water from entering the electronic device and thus reduce the possibility of getting damage and corrosion due to the water damage, so as to increase the service life of the electronic device.

DESCRIPTION OF DRAWINGS

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

DETAILED DESCRIPTION OF EMBODIMENTS

Figure 1:
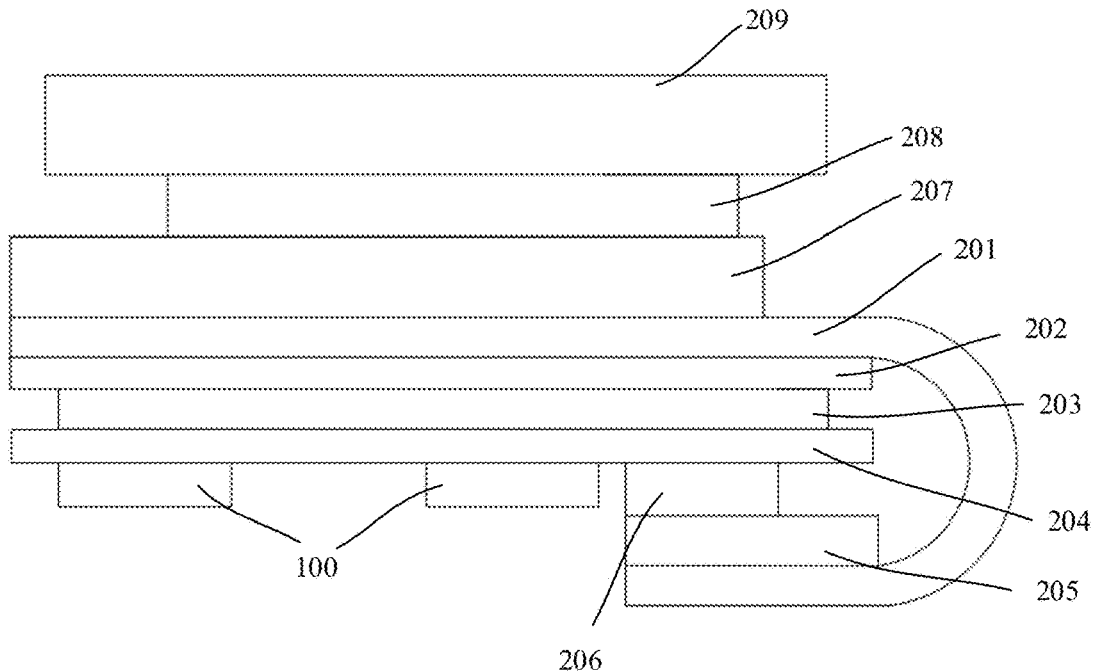
FIG. 1 is a schematic diagram of the module of an electronic device according to a preferrable embodiment of the present application.

In order to make technical solutions of the present application being clearly and completely described, the present application is further described in detail below with reference to the accompanying drawings and examples. It should be understood that the specific embodiments described herein are only a portion of embodiments, but not all. Other embodiments obtained, without the creative effort, by person having ordinary skill in the art from the embodiments of the present application belong to the claim scope of the present application.

In the description of the present application, it should be understood that the terms for indicating directions or positions, such as "above", "beneath", etc., are described referring to the direction or position in the drawings, instead of indicating or implying mentioned devices or components must have a specific location or must be formed or operated in a specific direction; therefore, it cannot be considered as a restriction or limitation to the present application. In addition, the terms "first" and "second" in the specification, the claims, and the figures of the present application are used to distinguish objects from each other, instead of describing a particular order or quantity. Thus, the terms described with "first", "second" can be considered as explicitly or inherently including one or more said features. In the description of the present application, "a plurality of" means two or more, unless otherwise expressly and specifically mentioned.

The reference numbers and/or annotations among different embodiments of the present application are repeatedly used for simplicity and clarity, which does not indicate the relationship among the embodiments.

In order to address the technical problems of poor heat dissipation and waterproof (hydrophobic) performance of the existing heat dissipation sheet made of graphene, the present application discloses adding copper powder in the fabrication process of graphene heat dissipation sheet, so that the copper-graphene composite powder with good sphericity can be obtained through mixing the copper powder with part of the graphene by the gas atomization process; since copper has good thermal conductivity in the z direction, the composite of copper powder and graphene can improve the heat soaking evenly-spreading efficiency in all directions, and thus enhance the heat dissipation performance of the graphene heat dissipation sheet; in the meanwhile, a heat evenly-spreading layer with specific microstructures can be fabricated by 3D printing technology, the heat evenly-spreading layer can not only increase the surface area to improve the heat dissipation efficiency of heat radiation, but also make water droplets on the surface of the heat dissipation sheet to form the Cassie state, so that the hydrophobic performance of the heat dissipation sheet can be improved.

Refer to FIG. 1, which is a schematic diagram of the module of an electronic device 1000 according to a preferrable embodiment of the present application. The electronic device 1000 comprises an electronic device body and a heat dissipation sheet 100, in which the heat dissipation sheet 100 is disposed on the electronic device body. In the present embodiment, the electronic device 1000 is a display device, such as a screen, a cell phone, and so on.

Specifically, the electronic device body comprises a display panel 201 and a first backplane 202 formed on a surface of the display panel 201 away from the display panel 201. The heat dissipation sheet 100 is formed on a surface of the first backplane 202 away from the display panel 201.

The display panel 201 comprises a bending portion (not marked in the figure), a first non-bending portion (not marked in the figure), and a second non-bending portion (not marked in the figure), the first backplane 202 is disposed on the first non-bending portion of the display panel. After the bending portion of the display panel 201 is bent, the second non-bending portion of the display panel 201 partially overlaps the first non-bending portion.

To be specific, the electronic device body further comprises a buffer layer 203 and a supporting plate 204. The buffer layer 203 is formed on a surface of the first backplane 202 away from the display panel 201, the supporting plate 204 is formed on a surface of the buffer layer 203 away from the first backplane 202, and the heat dissipation sheet 100 is formed on a surface of the supporting plate 204 away from the buffer layer 203.

In the present embodiment, the heat dissipation sheet 100 is attached to the supporting plate 204 through an adhesive layer. In another embodiment, the heat dissipation sheet 100 can be printed on the supporting plate 204 by the 3D printing technology as well.

Specifically, the electronic device body further comprises a second backplane 205 formed on the second non-bending portion of the display panel 201 and a reinforcing plate 206 configured as one end of the supporting plate 204.

Specifically, the electronic device body further comprises an optical functional layer 207 of the display panel 201 away from the first backplane 202, a bonding layer 208 formed on the optical functional layer 207, and a cover 209 formed on the bonding layer 208.

In an optional embodiment of the present application, the optical functional layer 207 is a polarizing layer. In another embodiment, the type of the optical functional layer 207 is not limited to the polarizing layer, and can be set and selected according to the actual needs.

The bonding layer 208 is pervious to light. In an optional embodiment of the present application, the bonding layer 208 is made of Optical Clear Adhesive (OCA). OCA is a kind of special adhesive used for gluing transparent optical element, which has a plurality of characteristics such as colorless and transparent, the transparency above 90%, good cementing strength, can be cured at room temperature or medium temperature, low curing shrinkage, and so on. When OCA is used as the adhesive to cover the optical functional layer 207, the visual performance of the display panel is less affected due to good transparency of OCA.

Both ends of the cover 209 protrude from the bonding layer 208 to avoid exposing the bonding layer 208. The cover 209 is usually made of glass or other transparent materials.

Figure 2:
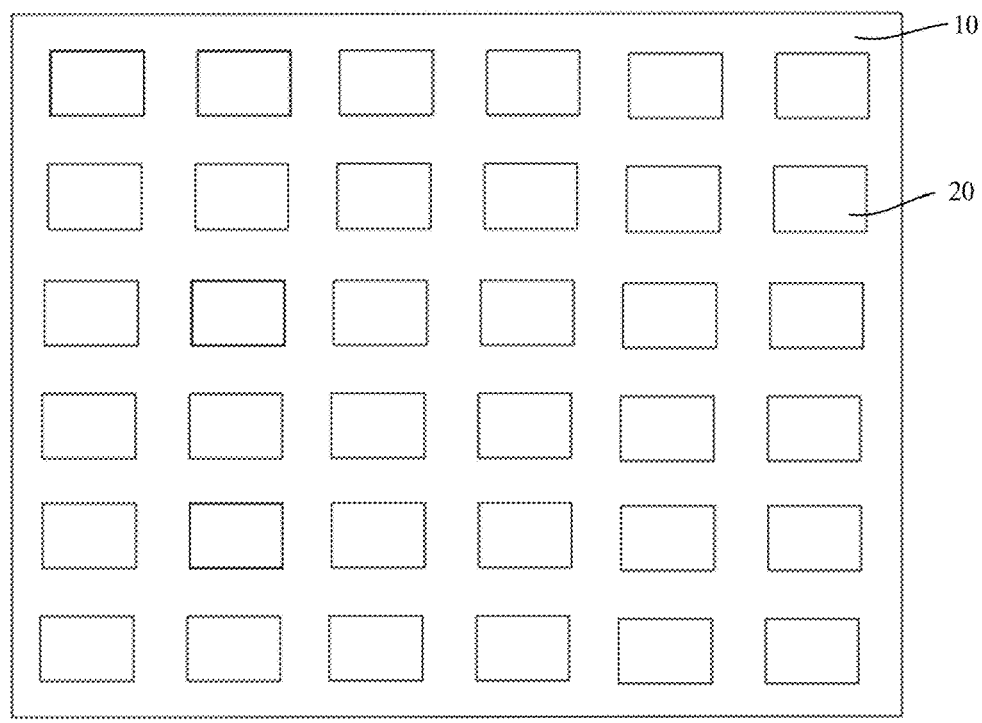
FIG. 2 is a top view of the heat dissipation sheet as shown in FIG. 1.
Figure 3:
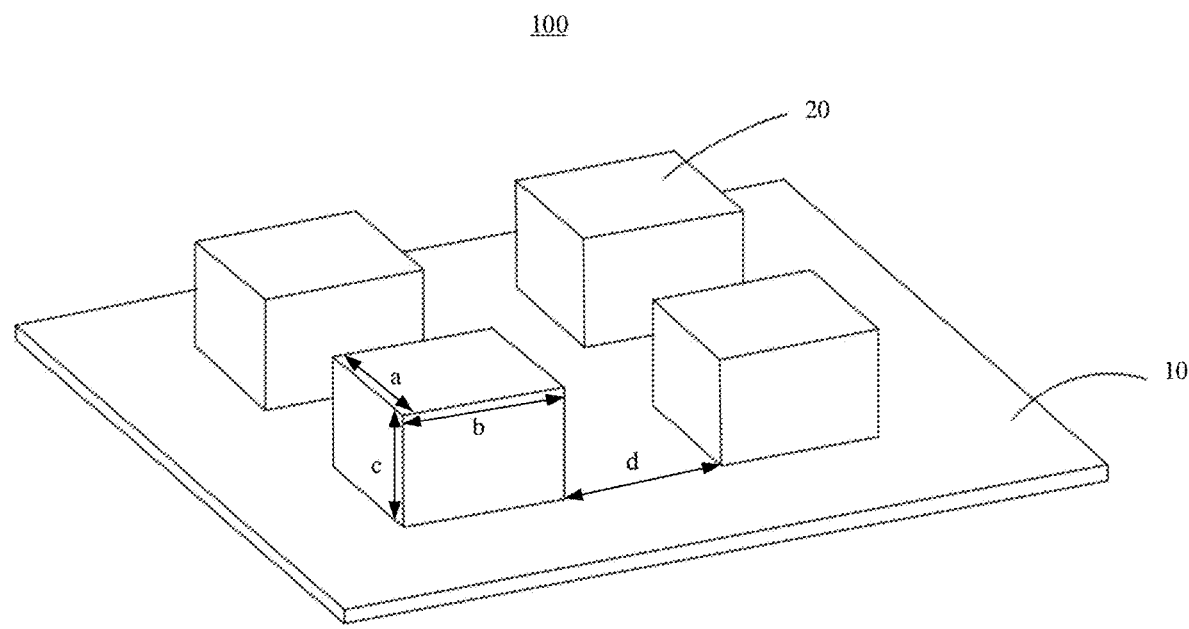
FIG. 3 is a partial zoom-in diagram of the stereogram of the heat dissipation sheet as shown in FIG. 2.
Figure 4:
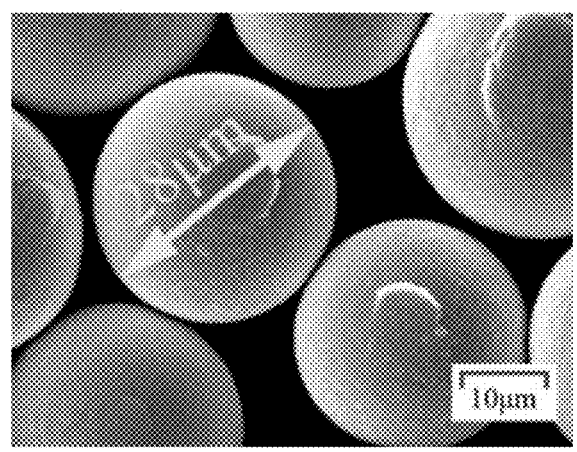
FIG. 4 is a field emission scanning electron microscope diagram of the copper-graphene composite powder in the heat dissipation sheet as shown in FIG. 3.

Specifically, refer to FIG. 2 and FIG. 3, the heat dissipation sheet 100 comprises a heat evenly-spreading layer 10 and a plurality of microstructures 20 formed on the heat evenly-spreading layer 10 and arranged in an array.

In an optional embodiment of the present application, the thickness of the heat evenly-spreading layer 10 is 60 μm to 80 μm. The thickness of the heat evenly-spreading layer 10 is controlled between 60 μm and 80 μm to make the graphene in the heat evenly-spreading layer 10 have a suitable thickness, so as to ensure the graphene in the heat dissipation sheet 100 having better heat dissipation performance.

In an optional embodiment of the present application, each microstructure 20 has a bump shape, and a cross section, parallel to the heat evenly-spreading layer 10, of each microstructure 20 is defined by a first width "a" and a second width "b"; a height of each microstructure 20 is defined by "c"; an interval between two adjacent microstructures 20 is defined by "d"; and 200 μm<a<300 μm, 200 μm<b<300 μm, c>115 μm, and 200 μm<d<400 μm. The reason for designing the numbers of a, b, and d to meet the above requirements 200 μm<a<300 μm, 200 μm<b<300 μm, and 200 μm<d<400 μm is to ensure water droplets (see FIG. 5) resting on the surface of the microstructures 20 form Cassie state, and thus the active waterproof effect can be achieved. In addition, c meets c>115 μm to prevent water droplets collapse, resulting in waterproof failure.

Preferably, a=b=250 μm, c=120 μm, and d=250 μm.

Figure 5:
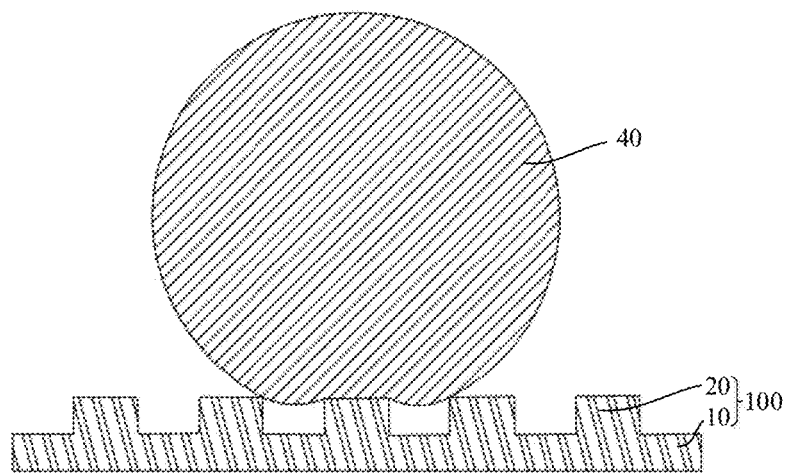
FIG. 5 is a schematic diagram illustrating the hydrophobic characteristic of the heat dissipation sheet as shown in FIG. 3.

Refer to FIG. 5, because there is a plurality of microstructures 20 on the surface of the heat evenly-spreading layer 10, the microstructures 20 can not only increase the surface area of the heat dissipation sheet 100 to enhance the heat dissipation efficiency of thermal radiation, but also cause the water droplet 40 to form Cassie state on the surface of the heat dissipation sheet 100 (specifically, on the microstructures 20), and thus realize the effect of active waterproof. Therefore, the heat dissipation sheet 100 is endowed with the function of self-contained waterproof and cleaning, so as to reduce the risk of malfunction to the whole device and improve user experience.

Refer FIG. 3 again, the heat dissipation sheet 100 is schistose. The heat dissipation sheet 100 further comprises a first graphene powder and a copper-graphene composite powder. The copper-graphene composite powder is mixed in the first graphene powder, and the copper-graphene composite powder is composed of a graphene-copper powder and a graphene powder.

Since copper has good thermal conductivity in the z direction, the composite of copper powder and graphene can improve the heat evenly-spreading efficiency in all directions, so that the heat dissipation performance of the graphene heat dissipation sheet 100 can be enhanced, and thus the efficient heat dissipation of the electronic device 1000 can be realized.

Specifically, in an optional embodiment of the present application, the copper-graphene composite powder is spherical, and the diameter of the copper-graphene composite powder is 20 μm to 30 μm.

The spherical copper-graphene composite powder has good fluidity, which can improve the quality of 3D printed products. In addition, a better sphericity can be obtained by controlling the diameter of the copper-graphene composite powder between 20 μm and 30 μm.

Specifically, in an optional embodiment of the present application, the mass ratio of copper and graphene in the copper-graphene composite powder is (28 to 36):(15 to 21) to ensure the content of copper in the copper-graphene composite powder, and thus ensure the terminal efficiency of the heat dissipation structure 100 in the z direction.

Specifically, in an optional embodiment of the present application, the mass ratio of the first graphene powder and the copper-graphene composite powder is (39 to 52):(8 to 15), so that the copper and graphene are tightly combined to increase the thermal efficiency of the heat dissipation sheet 100 in the z direction.

Specifically, in an optional embodiment of the present application, the mesh number of the first graphene powder is 625 to 1250 mesh to ensure the uniformity and compactness of the heat dissipation sheet 100.

Figure 6:
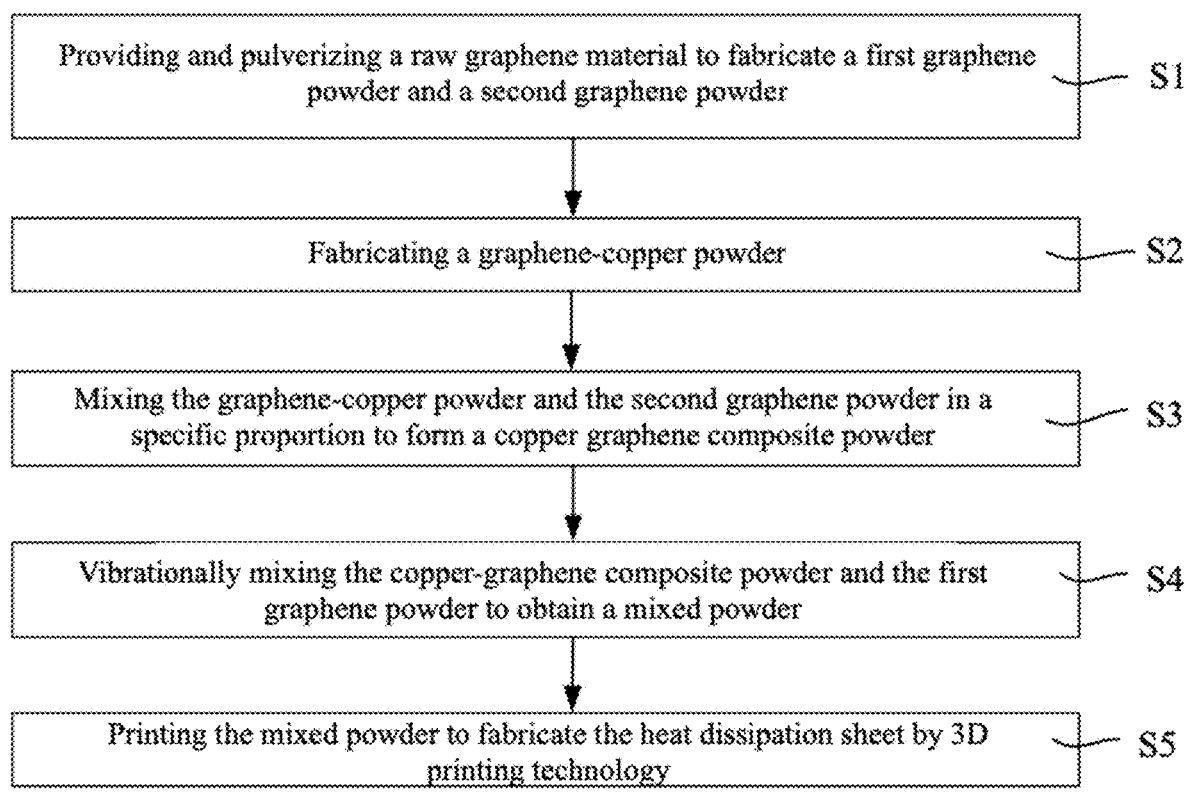
FIG. 6 is a flowchart for fabricating a heat dissipation sheet according to a preferrable embodiment of the present application.

Refer to FIG. 6, the present application further provides a fabrication method for fabricating the heat dissipation sheet 100. The fabrication method comprises following steps:

step S1: providing and pulverizing a raw graphene material to fabricate a first graphene powder and a second graphene powder;

step S2: fabricating a graphene-copper powder;

step S3: mixing the graphene-copper powder and the second graphene powder in a specific proportion to form a copper-graphene composite powder;

step S4: vibrationally mixing the copper-graphene composite powder and the first graphene powder to obtain a mixed powder; and printing the mixed powder to fabricate the heat dissipation sheet by 3D printing technology.

Specifically, the first graphene powder and the second graphene powder are fabricated by air current comminution method in step S1. Of course, in another embodiment, the first graphene powder and the second graphene powder can be also fabricated by mechanical comminution. In addition, the first graphene powder and the second graphene powder can be fabricated simultaneously or separately.

Specifically, in the present embodiment, the air comminution power is 20-22 kW, and the air pressure is 0.75-0.8 MPa.

The mesh number of the first graphene powder and the second graphene powder is 625 to 1250 mesh.

The copper-graphene composite powder is fabricated by the gas atomization process to ensure the uniformity and compactness.

Specifically, in step S2, the graphene-copper powder is fabricated as follows: first, providing another raw graphene and electroplating the copper on the surface of the another raw graphene; second, pulverizing the raw graphene having the copper electroplated on its surface by air or mechanical comminution to obtain the graphene-copper powder.

Specifically, in step S2, the mass ratio of copper and graphene powder in the copper-graphene composite powder is (28 to 36):(15 to 21) to ensure the content of copper in the copper-graphene composite powder, and thus ensure the terminal efficiency of the heat dissipation structure 100 in the z direction.

Specifically, in the present embodiment, the specific steps of step S2 includes: first, vibrationally mixing, at a vibration force of 60-80 Hz and 7000-8000 N, the graphene-copper powder and the second graphene powder for 50-60 minutes; next, melting the mixed graphene-copper powder and the second graphene powder to 1300-1400° C. in a vacuum by an electric arc furnace, and then air atomizing and cooling the mixed powder again to obtain the copper-graphene composite powder with the diameter of 20 μm to 30 μm.

Specifically, because the copper-graphene composite obtained in step S2 has relatively high temperature, step S2 can further includes a step: cooling the copper-graphene composite powder.

Specifically, the mass ratio of the first graphene powder and the copper-graphene composite powder is (39 to 52):(8 to 15) in step S4, so that the copper and graphene are tightly combined to increase the thermal efficiency of the heat dissipation sheet 100 in the z direction.

Specifically, the copper-graphene composite powder obtained from step S4 is spherical, and the diameter of the copper-graphene composite powder is 20 μm to 30 μm. The spherical copper-graphene composite powder has good fluidity, which can improve the quality of 3D printed products. In addition, a better sphericity can be obtained by controlling the diameter of the copper-graphene composite powder between 20 μm and 30 μm.

The heat dissipation sheet, the fabrication method thereof, and the electronic device using the same of the present application provide the following advantages: 1) copper powder was added in the fabrication process of graphene heat dissipation sheet, so that the copper-graphene composite powder with good sphericity can be obtained through mixing the copper powder with part of the graphene by the gas atomization process; since copper has good thermal conductivity in the z direction, the composite of copper powder and graphene can improve the heat evenly-spreading efficiency in all directions, and thus enhance the heat dissipation performance of the graphene heat dissipation sheet; 2) in the meanwhile, a heat evenly-spreading layer with specific microstructures can be fabricated by 3D printing technology, the heat evenly-spreading layer can not only increase the surface area to improve the heat dissipation efficiency of heat radiation, but also make water droplets on the surface of the heat dissipation sheet to form the Cassie state, so that the hydrophobic performance of the heat dissipation sheet can be improved; and 3) by forming the heat dissipation sheet on the electronic device body, the heat dissipation ability of the heat dissipation sheet can drain the heat generated by the electronic device body off to ensure the heat dissipation performance of the electronic device; in addition, the waterproof and hydrophobic characteristics of the heat dissipation sheet further prevent water from entering the electronic device and thus reduce the possibility of getting damage and corrosion due to the water damage, so as to increase the service life of the electronic device.

Specific exemplary embodiments are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A heat dissipation sheet, which is schistose and comprises a first graphene powder, further comprising:
a copper-graphene composite powder, mixed in the first graphene powder, wherein the copper-graphene composite powder is composed of a graphene-copper powder and a graphene powder;
wherein the copper-graphene composite powder is spherical;
wherein the mass ratio of the copper powder and the graphene powder in the copper-graphene composite powder is (28 to 36):(15 to 21);
wherein the heat dissipation sheet comprises a heat evenly-spreading layer and a plurality of microstructures formed on the heat evenly-spreading layer, the plurality of microstructures being arranged in an array and each having a cuboid shape.

2. The heat dissipation sheet as claimed in claim 1, wherein the diameter of the copper-graphene composite powder is 20 μm to 30 μm.

3. The heat dissipation sheet as claimed in claim 1, wherein the mass ratio of the first graphene powder and the copper-graphene composite powder is (39 to 52):(8 to 15).

4. The heat dissipation sheet as claimed in claim 1, wherein the mesh number of the first graphene powder is 625 to 1250 mesh.

5. The heat dissipation sheet as claimed in claim 1, wherein the thickness of the heat evenly-spreading layer is 60 μm to 80 μm; each microstructure has a bump shape, and a cross section, parallel to the heat evenly-spreading layer, of each microstructure is defined by a first width "a" and a second width "b"; a height of each microstructure is defined by "c"; an interval between two adjacent microstructures is defined by "d"; and 200 μm<a<300 μm, 200 μm<b<300 μm, c>115 μm, and 200 μm<d<400 μm.

6. A fabrication method for fabricating a heat dissipation sheet, comprising:
providing and pulverizing a raw graphene material to fabricate a first graphene powder and a second graphene powder;
fabricating a graphene-copper powder;
mixing the graphene-copper powder and the second graphene powder in a specific proportion to form a copper-graphene composite powder;
vibrationally mixing the copper-graphene composite powder and the first graphene powder to obtain a mixed powder, wherein the mass ratio of the first graphene powder and the copper-graphene composite powder is (39 to 52):(8 to 15); and
printing the mixed powder to fabricate the heat dissipation sheet by 3D printing technology;
wherein the copper-graphene composite powder is spherical;
wherein the mass ratio of the copper powder and the graphene powder in the copper-graphene composite powder is (28 to 36):(15 to 21).

7. The fabrication method as claimed in claim 6, wherein the heat dissipation sheet comprises a heat evenly-spreading layer and a plurality of microstructures formed on the heat evenly-spreading layer; each microstructure has a bump shape, and a cross section, parallel to the heat evenly-spreading layer, of each microstructure is defined by a first width "a" and a second width "b"; a height of each microstructure is defined by "c"; an interval between two adjacent microstructures is defined by "d"; and 200 μm<a<300 μm, 200 μm<b<300 μm, c>115 μm, and 200 μm<d<400 μm.

8. An electronic device, comprising an electronic device body; wherein the electronic device body comprises a display panel and a first backplane formed on a surface of the display panel; and wherein the electronic device further comprises a heat dissipation sheet, disposed on a surface of the display panel away from the first backplane; the heat dissipation sheet is schistose and comprises a first graphene powder, and the heat dissipation sheet further comprises a copper-graphene composite powder mixed in the first graphene powder, and the copper-graphene composite powder is composed of a graphene-copper powder and a graphene powder;
wherein the copper-graphene composite powder is spherical;
wherein the mass ratio of the copper powder and the graphene powder in the copper-graphene composite powder is (28 to 36):(15 to 21);
wherein the heat dissipation sheet comprises a heat evenly-spreading layer and a plurality of microstructures formed on the heat evenly-spreading layer, the plurality of microstructures being arranged in an array and each having a cuboid shape.

9. The electronic device as claimed in claim 8, wherein the electronic device body further comprises a buffer layer and a supporting plate, the buffer layer is formed on a surface of the first backplane away from the display panel, the supporting plate is formed on a surface of the buffer layer away from the first backplane, and the heat dissipation sheet is formed on a surface of the supporting plate away from the buffer layer.

10. The electronic device as claimed in claim 9, wherein the heat dissipation sheet is attached to the supporting plate through an adhesive layer.

11. The electronic device as claimed in claim 8, wherein the diameter of the copper-graphene composite powder is 20 μm to 30 μm.

12. The electronic device as claimed in claim 8, wherein the mass ratio of the first graphene powder and the copper-graphene composite powder is (39 to 52):(8 to 15).

13. The electronic device as claimed in claim 8, wherein the mesh number of the first graphene powder is 625 to 1250 mesh.

14. The electronic device as claimed in claim 8, wherein the thickness of the heat evenly-spreading layer is 60 μm to 80 μm.

15. The electronic device as claimed in claim 14, wherein each microstructure has a bump shape, and a cross section, parallel to the heat evenly-spreading layer, of each microstructure is defined by a first width "a" and a second width "b"; a height of each microstructure is defined by "c"; an interval between two adjacent microstructures is defined by "d"; and 200 μm<a<300 μm, 200 μm<b<300 μm, c>115 μm, and 200 μm<d<400 μm.

* * * * *